United States Patent [19]

Moore et al.

[11] Patent Number: 5,402,807
[45] Date of Patent: Apr. 4, 1995

[54] MULTI-MODULAR DEVICE FOR WET-PROCESSING INTEGRATED CIRCUITS

[76] Inventors: David R. Moore, 471 G Nelo St., Santa Clara, Calif. 95054; Eugene R. Moore, 5600 Woodview Pass, Midland, Mich. 48642

[21] Appl. No.: 94,445

[22] Filed: Jul. 21, 1993

[51] Int. Cl.⁶ .............................................. B08B 3/04
[52] U.S. Cl. ......................................... 134/61; 134/902
[58] Field of Search ................. 134/66, 79, 80, 902, 134/61

[56] References Cited

U.S. PATENT DOCUMENTS

| | | | |
|---|---|---|---|
| 4,345,615 | 8/1982 | DiCicco et al. | 134/902 X |
| 4,520,834 | 6/1985 | DiCicco | 134/902 X |
| 4,827,954 | 5/1989 | Layton | 134/902 X |
| 5,156,174 | 10/1992 | Thompson et al. | 134/902 X |
| 5,168,886 | 12/1992 | Thompson et al. | 134/902 X |
| 5,191,908 | 3/1993 | Hiroe et al. | 134/902 X |
| 5,265,632 | 11/1993 | Nishi | 134/902 X |

FOREIGN PATENT DOCUMENTS

| | | | |
|---|---|---|---|
| 241417 | 8/1992 | Japan | 134/902 |
| 3187 | 1/1993 | Japan | 134/902 |
| 2126710 | 3/1984 | United Kingdom | 134/902 |

*Primary Examiner*—Philip R. Coe
*Attorney, Agent, or Firm*—Merlin B. Davey

[57] ABSTRACT

This invention relates to an improved automatic processing system and process for handling delicate objects in a controlled, low particulate atmosphere, and an improved method for constructing such apparatus. This system is particularly useful in the wet processing of semiconductor wafers, integrated circuits and similar delicate electronic devices. This invention also relates to semiconductor wafers, integrated circuits and similar delicate electronic devices produced by the above processing system and process.

6 Claims, 2 Drawing Sheets

MULTI-MODULAR DEVICE FOR WET-PROCESSING INTEGRATED CIRCUITS

BACKGROUND OF THE INVENTION

This invention relates to an improved automatic processing system and process for handling delicate objects in a controlled, low particulate atmosphere, and an improved method for constructing such apparatus. This system is particularly useful in the wet processing of semiconductor wafers, integrated circuits and similar delicate electronic devices.

In the manufacture of integrated circuits, there are many processing steps that involve the submersion in liquid processing media. This media may be a chemical media designed certain qualities to sections of the in process circuit, or it may have a cleaning function, or it may be a resist removal or it may be simply a wash step or the like. In all cases it is desired that both the atmosphere above the wet processing steps and the baths containing the fluid be as free of particulate matter as possible. The amount of particulates present in both the bath and the air will play a controlling role in the percentage of flaw-free circuits that can be produced in any given processing step. With only a slight reduction in particulate control procedures, the percentage of flaw-free circuits will fall to near zero.

Many improvements have been made to control the particulates during these delicate operations. A major improvement was the use of isolated areas, often called clean rooms, which have a controlled, carefully filtered, atmosphere. Care is taken in this room to control entry and exit and motion in the room. Entry and exit of personnel would be through an intermediate room or series of rooms that are successively cleaner. At each stage of entry, precautions are taken to prevent carry over of particles from the previous dirtier station. At the point of final entry, the entering person will normally have a complete covering of over garments which have a relatively low tendency to produce dust particles when moved, and are free from dust particles from the previous more dusty areas and cover the parts of the body such as skin, and hair, which can contribute dust particles. Breathing passages are usually covered with a filtering type mask.

Care is also taken within the clean room to prevent redistribution of dust particles that will have settled on static surfaces such as the floor, bench tops, or other work surfaces. From the standpoint of engineering controls, this is carried out by controlling the distribution of the incoming, filtered air. Precautions are generally taken, for example, to control the velocity of the air so that it is minimized to reduce its ability to lift deposited particles and render them air-born. Particularly efforts are made to prevent reaching the higher air velocities that will create turbulent flow patterns. Care is generally exercised to be certain that all incoming air is directed in a downward direction so as to minimize the tendency to lift the particles, causing them to again become airborne.

There is, however, a limit on the ability to control the air currents caused by the motion of a person in the clean room environment. Because of the physical size of the human body, and of the difficulty in controlling speed of movement, it is nearly impossible to move about in the clean room environment without creating turbulent air currents that will tend to lift settled particulates and cause them to be redistributed into the air where they have the opportunity to find a way to the in-process circuitry. One partial solution to this has been to reduce the amount of air movement caused by the human body by reducing the amount of the body entering the clean environment by the use of glove boxes. The glove box involves using large rubber gloves that are permanently attached to the wall of the room (which is normally significantly smaller then the walk-in type clean rooms). Hands and usually entire arms are carefully inserted into these gloves which can then be used to manipulate the integrated circuit precursors through various processing steps. Such a device would typically be called a glove box, or a clean glove box. In addition to the obvious size limitation imposed by the length of the human arm, this device has other limitations. The difficulty in controlling the speed and the erratic motion of the human arms still causes turbulent air flow with a resultant redistribution of settled dust particles. These difficulties along with difficulties performing repetitive operations with a high degree of reproducibility have made mechanical devices more popular.

When these mechanical devices are operated by computers, they overcome many of the above difficulties and have become very valuable in carrying out operations in clean rooms. They can be programmed to do repetitive tasks in very reproducible manners and they can be programmed to operate slowly enough to minimize the air turbulence created.

Such a device has been disclosed in U.S. Pat. No. 4,805,759. The '759 patent discloses "an installation for conveying delicate objects such as semiconductor layers during processing operations and for handling such objects in a controlled atmosphere, where, "wheeled carriages are drawn along tracks by an endless belt" and "By means of transfer tools, object-holding cassettes are taken from the carriages during operation and replaced on the carriages after processing". In the '759 patent, many of the problems associated with human operation in a clean room, as noted above, are overcome.

Unfortunately, the great number of sliding moving parts such as bearings and frictional surfaces utilized in the practice of the '759 patent cause tiny, dust-like, particles to be created as the metal wears. These particles then contribute greatly to the problems associated with attempting to maintain the reduced particulate atmosphere that is necessary in a clean room. The apparatus used in the '759 patent is also very large and cumbersome. Because of this, its movement creates more air movement than desired. This air movement in turn causes an undesired suspension and redistribution of the settled dust particles, which are unfortunately much more numerous because of the inherently dirty nature of this cumbersome machine. These dust particles cause devices such as integrated circuits produced by the practice of the '759 patent to have a lower percent of flaw-free, or minimum flaw, parts produced than desired.

In addition, the cumbersome nature of the '759 patent apparatus makes it difficult to maintain. To do repairs, it is necessary to enter the clean environment for an extended time, thus introducing contaminants when entering, and continuing to generate contaminants while in the clean area. The resulting contamination that is introduced to the clean room must be laboriously removed before the operation can be restarted. Even with the laborious cleaning procedures, there will often be a period of poor productivity after restarting the operation where the percentage of flawed parts will be higher than even the already high steady state percentage. The cumbersome nature of the apparatus with its many bearings, sliding surfaces and spread out nature, further, makes it more difficult to maintain.

In addition, the '759 patent uses conventional continuously rotating electric motors. The continuously rotating electric motors create additional problems that can only partially be dealt with. The requirement for a continuous flow of air for cooling, coupled with the frictional contacts (required for brush operated motors) makes necessary the isolation of the motor from the clean room. This isolation can be accomplished with a cowling as in the '759 patent, or by operating the motor outside of the clean room and bringing the shaft through the wall. Either of these techniques place severe mechanical restraints on design flexibility of the apparatus that will become clearer as our invention is defined further.

Further the apparatus of the '759 patent is relatively difficult to construct, with each part being different from other parts. With the '759 patent type of construction, it is necessary to have the entire area of the clean room (or clean box) set aside for the duration of the its assembly.

Another computer operated mechanical device for handling semiconductor wafers is disclosed in U.S. Pat. No. 4,904,153. The '153 patent discloses a "Transporting robot for semiconductor wafers". It describes a robotic arm assembly that is capable of moving items from processing station to processing station by traversing back and forth on an overhead rail within a clean room. The '153 patent suffers many of the difficulties of the '759 patent since its internal sliding rails provides for excessive particulate generation and the apparatus must be maintained by physically entering the clean room, with the resulting air currents that resuspend particulates. The resulting contamination and reduced productivity after repairs, results in a significantly higher rate of flawed integrated circuits than would be desired. Its non-modular nature makes construction and maintenance more expensive and difficult.

In the manufacture of integrated circuits, there are many wet processing steps that involve the submersion in liquid processing media. This media may be a chemical media designed to impart certain qualities to sections of the in process circuit, or it may have a cleaning function, or it may be a resist removal or it may be simply a wash step or the like. Typically employed in such wet processing steps would be etch solutions such as aqua regia (about 75% HCl and 25% nitric acid) often employed as a gold etchant, a buffered oxide etch such as ammonium fluoride and HCl in an aqueous base typically employed in a ratio of 4:1 to 20:1 as an etch for $SiO_2$, a mixture of phosphoric acid, acetic acid, and nitric acid commonly employed at a ratio of 16:1:1 at 85% total conc. in water to etch metals, or nitric acid and hydrofluoric acid in a ratio of about 9:1, or mixtures of hydrochloric and nitric acid in a concentration of 37–38% and 71–72% frequently used with molybdenum, platinum or nichrome. Typically employed in such wet processing steps might be an organic solvent or mixture of solvents to remove one type of a photo resist, alternately an acid resist strip such as sulfuric acid and ammonium persulfate might be used for $SiO_2$ resist stripping, or "phenolic stripper" solutions might be used for other types of resist and/or other substrates. In some cases chromic sulfuric acid resist removal baths might be used, particularly with metalized resist stripping. Resist developer solutions might also be used. Sometimes it is desired to used cleaning solutions such as the "two step process" for prediffusion cleaning of quartz ware where first water and hydrogen peroxide and ammonium fluoride in a ratio of 5;1;1 are used followed by a solution of water, hydrogen peroxide and hydrochloric acid in a 7:2:1 ratio, both at 75–85 degrees C., are used. Sometimes a rinse with a very clean organic solvent or water is desired.

SUMMARY OF INVENTION

This invention provides a circular or semi-circular, multimodular device for wet processing of semiconductor wafers, integrated circuits, and similar delicate electronic components within that device comprising:

a. a centrally located robotic arm capable of servicing several modular units, containing wet processing baths located around the robotic arm, each such processing unit having primarily standard dimensions, b. said robotic arm being movable in at least two dimensions, vertically and rotationally, and having means, to grip or otherwise hold individual and groups of integrated circuits and other delicate electronic devices while being processed, said robot arm having reduced sliding surfaces and a cover to isolate said surfaces from said clean atmosphere, c. means for filtering air, and d. means for addition and removal of said integrated circuits and other delicate electronic devices.

This invention further provides a circular or semicircular multi-modular device for wet processing of integrated circuits, and similar delicate electronic components as above where such device maintains a cleaner atmosphere within that device than outside of that device.

This invention still further provides the above device having the means for moving said robotic arm in at least three dimensions, vertically, horizontally in a radial direction and to rotate and to grip or otherwise hold individual and groups of integrated circuits and other delicate electronic devices while being processed.

In a further embodiment the invention provides the above devices wherein the filtered air is flowing in a downward direction.

In a still further embodiment the invention provides a process employing the above modular devices for carrying out necessary wet processing steps in the production of integrated circuits and other delicate electronic devices.

In a still further embodiment the invention provides integrated circuits and other delicate electronic devices produced by the use of the above processes.

In a still further embodiment the invention provides a process for the construction of the above devices wherein the multi-modular device for wet processing is constructed as individual module units that are later assembled at a separate processing site to provide a modular apparatus for the wet processing of integrated circuits and similar electronic devices.

In a still further embodiment the invention provides a device constructed as described above which involves 6 modular units.

In a still further embodiment the invention provides a device constructed as described above which involves 8 modular units.

In a still further embodiment the invention provides a device constructed as above where fewer units than required to complete a circle are employed.

In a still further embodiment the invention provides a device constructed as above where all modules are identical in outside dimensions.

In a still further embodiment the invention provides a series of two or more or the above devices connected so that items may be passed from the robot arm of one device to the robot arm of another device.

In a still further embodiment the invention provides the above apparatus where sliding parts are covered in such a way as to allow a flow of air to sweep particulates out of the clean area.

In a still further embodiment the invention provides the above multi- modular device where said centrally located robot arm is compact enough that it can be easily replaced.

In a still further embodiment the invention provides semi-conductor wafers, integrated circuit and similar delicate electronic devices produced by the above apparatus.

In a still further embodiment the invention provides an apparatus for the wet processing of integrated circuits and similar electronic devices which because of its being composed of several similar modules, allows simpler and more economical construction and maintenance than was possible in the past, with an accompanying ease of transportation and increased productivity of high quality circuits after being shut down for repairs and processing reinitiated.

In a still further embodiment the invention provides a process for producing a multi-modular apparatus for the wet processing of integrated circuits and similar electronic devices in which identical or very similar modules are constructed in a reduced space work area and transported to a remote use area.

In a still further embodiment the invention provides a modular apparatus for the wet processing of integrated circuits and similar electronic devices which because of its unique flexibility provides the opportunity to be coupled with similar apparatuses so that devices being processed can be passed from one such station to the next, for an additional series of processing, without having to leave the reduced particulate environment provided by this invention.

In a still further embodiment the invention provides integrated circuits and similar electronic devices that have fewer flaws per device caused by the operation in the very clean atmosphere provided when one employs the multi-modular apparatus for the wet processing of integrated circuits and similar electronic devices of this invention.

In a still further embodiment the invention provides a multi-modular apparatus for the wet processing of integrated circuits and similar electronic devices which as a result of the similarity between modules makes programming for complex operations simpler since the similar dimensions will allow many identical programming steps to be used.

DETAILED DESCRIPTION OF THE INVENTION

Figure 1:
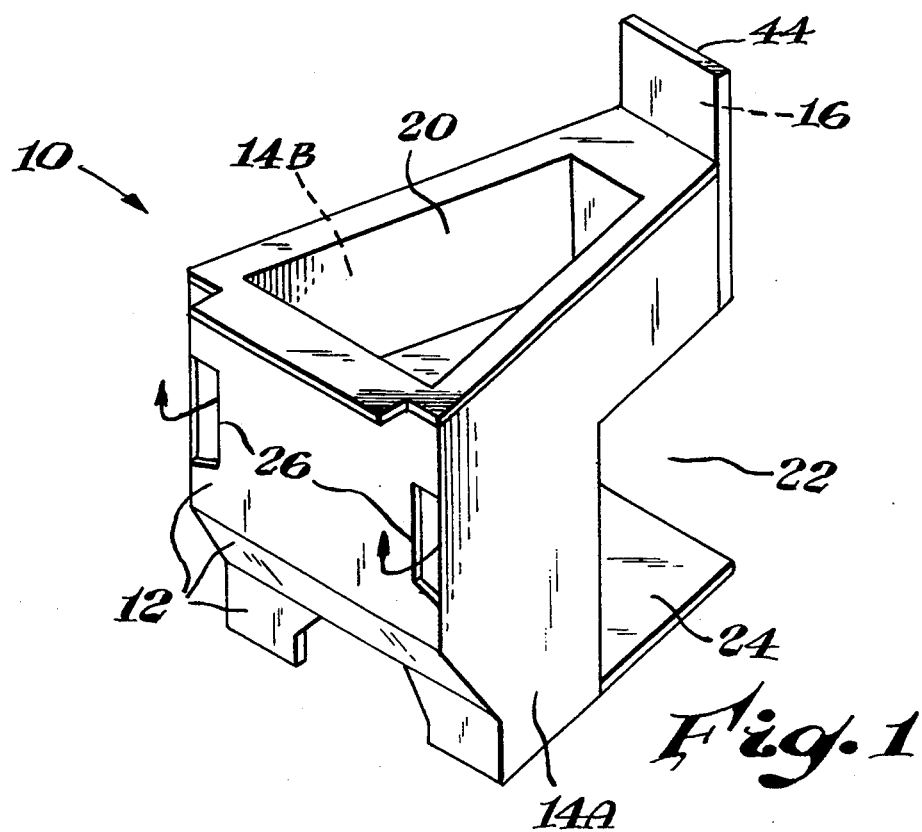
FIG. 1 is a drawing of components of a single module that can be duplicated for producing multiple-unit modules in accordance with the present invention.

This invention is a multi-modular apparatus for the wet processing of integrated circuits and similar electronic devices. This invention will be further understood by reference to the accompanying drawings wherein:

FIG. 1 is a drawing of components of a single module that can be duplicated in producing multiple-unit modules. The base unit (10), is composed of a front panel (12), which may be a single panel or multiple panels where desired, of two sides (14A, & 14B), and a back surface (16) which may optionally be combined with the particulate shield (18, FIG. 2) around the central robotic arm. The base unit may contain a built in or a removable processing tank (20). The sides of the base unit may contain openings to act as air return passages in either or both sides (22). The (24) space under the tank may advantageously be used to house air circulation and filtration equipment. The front of the base unit may contain openings to act as air ducts (26) which will be useful to provide a source of filtered air through the side closure and air duct (28, FIG. 5), and the upper side support and air duct (30, FIG. 5) to the top support and air duct (34, FIG. 5) of the modular unit. Bottom support covers with air diffusion holes may be used to distribute the downward air flow uniformly into the multi-modular unit. Window supports may be provided on both edges of the side support to provide a means to attach a transparent window to the assembled multi-modular unit. Roof panel supports may also be attached to both edges of the top support and air duct. When modules are combined, the back surfaces will provide a space (44) for the centrally located robotic arm assembly (46, FIG. 2).

Figure 2:
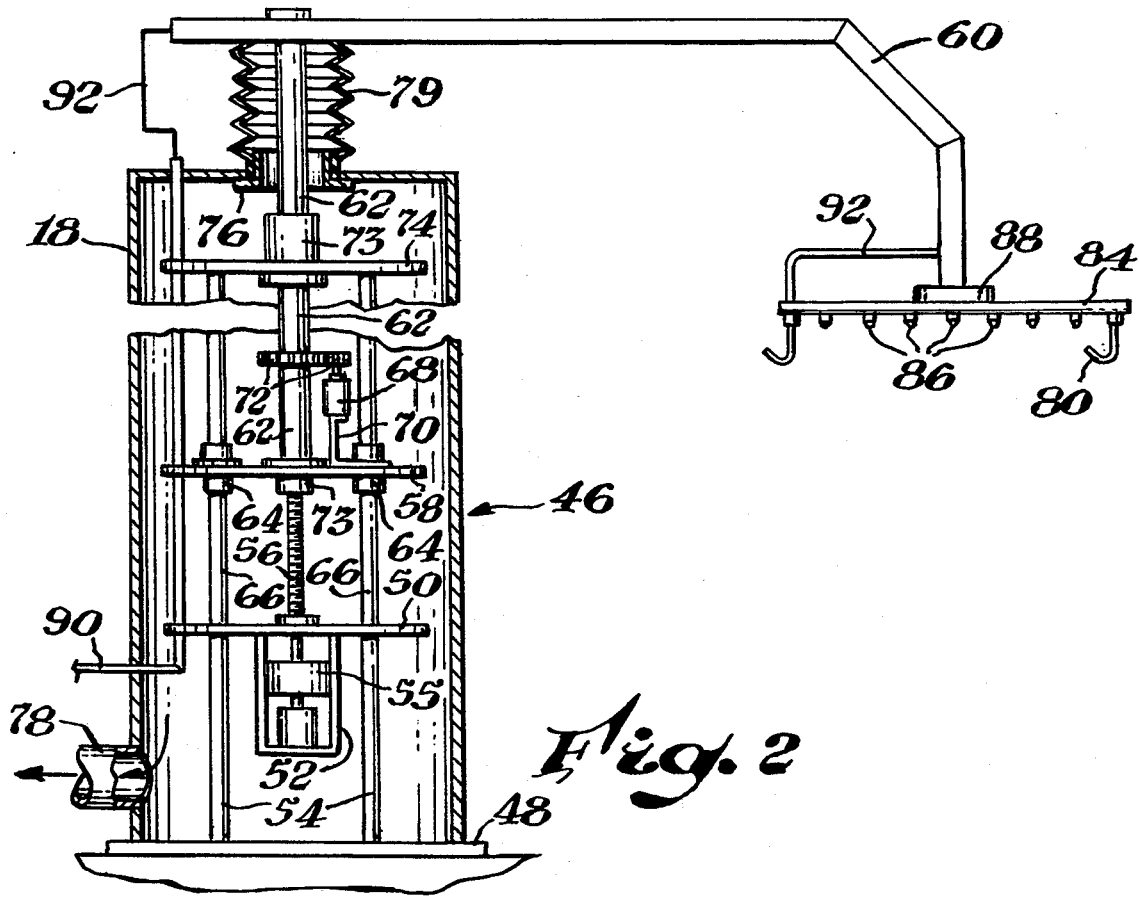
FIG. 2 illustrates a centrally located robotic arm assembly in a cutaway view with important components.

FIG. 2 shows the centrally located robotic arm assembly (46) in a cutaway view with important components. The base plate (48) may be fastened to the floor to provide extra stability. A vertical drive mounting plate (50) is attached to the base plate by two or more supports (54) and provides support for the vertical motion stepping motor type drive unit (52) and optional gear assembly (55). The vertical motion drive unit rotates the vertical drive screw (56) causing the robotic arm (60), the support shaft (62) and the movable center plate (58) to go up and down. The movable center plate is supported with a pair or circular bearings (64) which ride up and down on a pair of guide rods (66). The rotational motion is provided by a stepping motor type rotational drive (68) which is attached to the movable center plate by drive mount (70). A drive gear set (72) is mounted on the motor and the support shaft to allow a computer signal to the rotational drive motor to cause the robotic arm to rotate while supported by the two bearings (73) which are supported by two plates (74 and 58). A particulate shield (18) is provided to assure that any particulate material generated by the drive units for the robotic arm can be exhausted through the exhaust duct

(78) which is provided with a suction blower (not shown). The top of the rotating elastomeric bellows (79) is connected solidly to the rotating arm and to the top of the particulate shield by a rotating flange (76) which may be maintained in rotational contact with the top of the particulate shield by the tension provided by the extended bellows or by other mechanical means. Suction within the particulate shield will assure that particulates generated by this rotating contact do not reach the processing area containing the baths. A sample support with three hooks (80) allows a carrier of integrated circuits or other delicate electronic devices to be moved. This device may be supplied with tubes (84) which have nozzles (86) or orifices to supply air for fluid removal or fluid for rinsing (or further treatment). Attachment bar (88) is used to attach the sample support to the rotating arm.

Air or fluid is supplied to the sample support area through fixed conduit (90), then flexible conduit (92) which passes through the rotating robotic arm and attaches to the tubes (84) on the sample support device.

Figure 3:
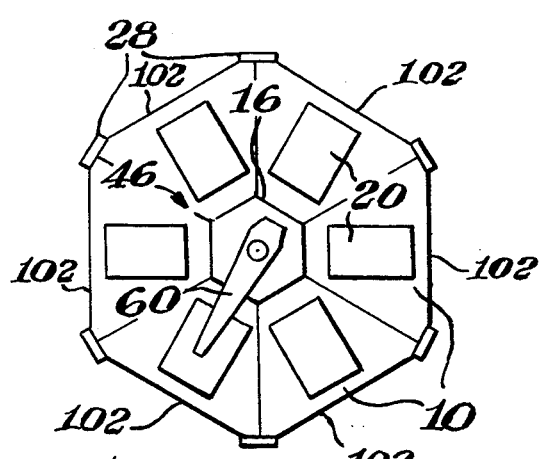
FIG. 3 represents a top view of the lower section of a 6-unit multi-modular device that is shown in part with base units.

FIG. 3 is a drawing that represents a top view of the lower section of a 6 unit multi-modular device which is shown in part with 6 base units (10). Each base unit is shown with a processing tank (20). The units are fastened together on the outside with the side closure and air duct units (28) and on the inner surfaces by a base unit back surface (16) which also serves as a particulate shield for the rotating arm assembly. The rotating arm (60) is shown above the base units. Parts to be treated may be introduced into a single base unit and removed from another base unit or from the same base unit after they have been passed through all 6 processing tanks. Alternately, the unit may be beneficially utilized with a reduced number of baths. This further illustrates the extreme versatility of these multi-modular devices. Loading and unloading of parts will normally be accomplished by removing the windows from the window supports either manually or with a robotic device. Outward flow of filtered air will help prevent contamination during this operation.

The lower section of the unit may be used as shown within a room where the atmosphere within the entire room maintains the low particulate level required for the operation. Particulate control advantages are provided by the characteristics of the centrally located robotic arm. In this case ease of engineering and construction of the multi-modular device would remain as one of the unique features.

Figure 4:
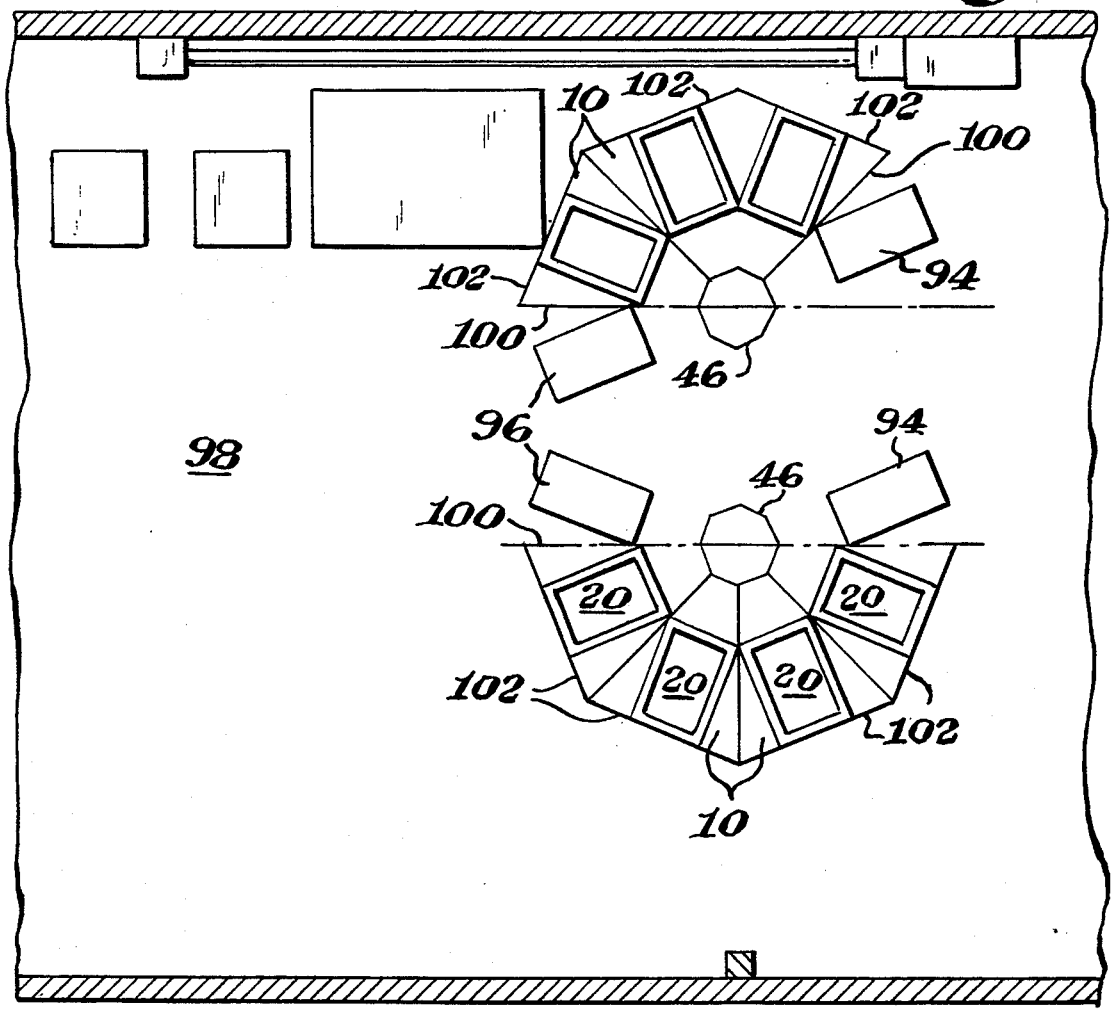
FIG. 4 shows an alternate arrangement where base units are constructed so that when 8 are placed together they would form a single unit covering a full 360 degree circular area.

FIG. 4 shows an alternate arrangement where base units (10) are constructed so that when 8 are placed together they would form a single unit covering a full 360 degree circular area. Seven of these base units are arranged within a reduced particulate room in a fashion which facilitated human interaction. The loading stations (94) may be supplied with parts to be treated either manually or with an auxiliary robotic device. Treated parts may be removed from the unloading stations (96) either manually or with an auxiliary robotic device. In both loading and unloading, a physical barrier (100) or the simple barrier of outflowing-filtered air will maintain a cleaner area within the processing chambers than in the outer room (98). When a physical barrier (100) is used, robotics may be used to coordinate its opening with the robot arm assembly (46) or a manual operation may be initiated by an alert signal from the control computer.

Figure 5:
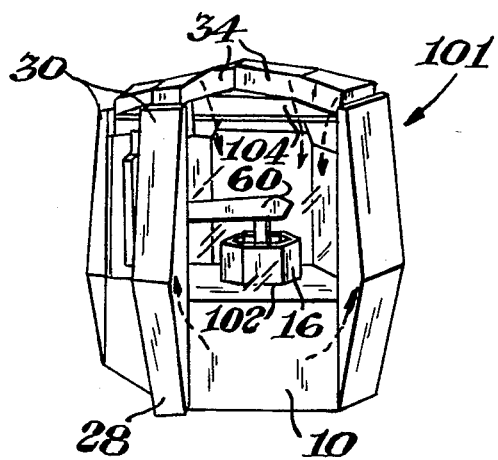
FIG. 5 is an isometric drawing of an assembled multi-modular unit.

FIG. 5 shows an isometric drawing of an assembled multi-modular unit (101). Six base units (10) are fastened together with the side closure and air duct (28), the side closure and air duct (30), and top support and air duct (34). Windows (102) and roof panels (104) are installed. The robotic arm (60) and the particulate shield (16) are shown. A suitable flexible or rigid caulking compound may be used to seal small holes and gaps.

Other advantages of this invention are that it will:

1. Provide an improved degree of cleanliness by virtue of its unique construction and the improved process thus made possible.
   a) A major part of this improvement is caused by the ability to totally eliminate exposed sliding interfacial surface contact of metal or other materials of construction. The location of the processing stations around a centrally located robotic arm is of key importance in making it possible to totally eliminate exposed sliding interfacial surface contact. The centrally disposed robotic arm becomes the only moving part, and its sliding surfaces can be entirely contained in a cover or "cowling". The generated particulate material may then be entirely contained within the cowling. Additionally, a slight flow of air may be used to assure that all fine particles generated are exhausted to an area outside of the low particulate processing area.
   b) Another desired feature for the practice of our invention is the use of the "single motion" electric motors commonly called "stepping motors" which by avoiding the use of conventional continuously rotating electric motors, are able to avoid the particulates generated by such continuously rotating motors, without the geometric restrictions that would be placed if it were necessary to place the motors outside the clean room. Currently stepping electric motors are most well developed and integrate best with computers for control purposes. Hydraulic motors can in some cases be used effectively and where used have the advantage of improved cleanliness.
   c) The centrally located arm allows such a compact design that when maintenance is required, the centrally located arm can be easily and quickly removed. This avoids the problems associated with entering the clean area for extensive periods with all the tools necessary to do complete maintenance. Another advantage of the easily removable centrally located arm is the ability to exchange a non-operating arm in need of repair very quickly for an operational arm thus minimizing productivity losses due to down-time while the mechanical arm is being repaired outside of the clean area. In some cases, using extra precautions, it is possible to change arms with reduced contamination of the in-process devices already being processed in our apparatus.

2. Provide a simpler process for construction and a high degree of versatility by means of symmetrical geometry which allows for modular design.
   a) The process of construction is made simpler with the centrally located arm because of the symmetry that allows the many key dimensions to be standardized between the modular units that surround the centrally located arm. For example, a six sided unit would be built up from six nearly identical units that would fit circumferentially around the centrally located arm. The similarity of the six units would allow ease in cutting the individual parts to be assembled, since key parts could be cut in sets of six. Likewise calculations and layouts are simplified since they also are reduced. Assembly is particularly made easier since special jigs and holding devices to allow assembly ease, once made, can be uses for all six modules.

b) Detailed designing of a particular multi-modular device is made easier because six times (in this case) the design efforts can be focused on a module of the facility, which is then used several times over in constructing the entire device.

c) The multi-modular design made possible by the centrally located robotic arm allows a degree of versatility that can not be accomplished with past art. While maintaining standardized overall dimensions for ease of design and construction, the internal details of a module can be modified to fit a particular need. One module for example might be fitted with special facilities to provide agitation of the bath with a mechanical device, such as a rotating agitator or a plunger type displacement device, or an ultrasonic device or the like. Another module might be equipped with a continuous recirculation and filtration device to remove particulates that are created as a consequence of the processing step, or to provide a particularly high degree of particulate control. Another module might be equipped to allow frequent changing of the fluid in the wet processing step as the fluid becomes spent or contaminated.

This invention, thus, allows new versatile units to be easily constructed to carry out a variety of wet processing steps and also allows for versatility in modification of units that have been operated for a time before changing needs require modification of such units to allow them to continue to function. Such modification could involve changing only one module or several. If desired, this invention allows for a spare module to be made ready while the main unit remains in full production, until the time of change, allowing a great increase in productive use of the multi-module device.

d) By having a partially standardized geometric scheme, it is possible to significantly simplify programming of a computer to operate the robotic arm through the series of sequential operations in successive modules. As a result of the similarity between modules the programming for complex operations is simpler since the similar dimensions will allow many identical programming steps to be used.

3. The standardization of modules makes it possible to link entire units (each composed of several modules) together, allowing one centrally located arm to pass to another centrally located arm in the next entire unit and so on. One of the modules of each unit may serve simply as a passageway, or there may be a processing bath in the "passage" module that is used to treat the "load" of devices immediately before the in-process devices are passed to the next entire unit. The units may be connected in groups of two, or if desired a long line of units may be so connected until as many processing steps as desired are included into what now may be either an interconnected clean room, or a series of individual clean rooms with moveable closures between them.

EXAMPLES

EXAMPLES 1-4

For comparative purposes a series of apparatuses is constructed, Example 4 being in accord with this invention, the other three in accord with the currently known art.

EXAMPLE 1

An apparatus is assembled according to U.S. Pat. No. 4,835,711 except that wet processing tanks are added so that it can be used for the wet processing of integrated circuits and similar electronic devices. This apparatus is noted to have sliding surfaces that can produce metallic or polymeric particulates. This apparatus is also noted to be absent of means to supply a source of low particulate air to the processing area.

EXAMPLE 2

An apparatus is assembled according to U.S. Pat. No. 4,805,759 so that it can be used for the wet processing of integrated circuits and similar electronic devices. This apparatus is noted to have many bearings and sliding surfaces that can produce small metal particulates. It is also noted to be very time consuming to engineer the detailed design because each detail must be individually designed. It is also noted to consume space in the final area of utilization during the entire construction time, since it is too large to be conveniently transported once construction is complete.

EXAMPLE 3

An apparatus is assembled according to U.S. Pat. No. 4,904,153 so that it can be used for the wet processing of integrated circuits and similar electronic devices. This apparatus is noted to have some bearings and sliding surfaces that can produce small metal fragments. It too is noted to be difficult to engineer the detailed design because each detail must be individually designed. This apparatus is also noted to consume space in the final area of utilization during the entire construction time, since it also is too large to be conveniently transported once construction is complete. Maintenance on this unit and the unit of Example 2 are noted to be undesirably difficult due to their non centrally located arm being essentially non-removable. It is noted in both cases that, when repair is needed, all the partially completed, in-process devices are flawed so badly as to be unusable. Contamination introduced during maintenance accounts for a 40% loss in usable product, due apparently to contamination caused flaws, that is observed for the first 36 hours of operation.

EXAMPLE 4

An apparatus is assembled according to the present invention so that it can be used for the wet processing of integrated circuits and similar electronic devices. This device is supplied with a means of maintaining a low particulate air supply in the processing area and is noted to have minimal number of open, sliding surfaces that can wear and create polymeric or metallic particulates. During design, construction and assembly of the apparatus, it is noted that: the design time is greatly decreased and at the same time it is possible to spend more time optimizing the design since the design needs only to be optimized one time to serve all the modules. It is also noted that during construction no space is needed in the valuable, final processing area. It is also noted that much less shop area is needed during construction, since only a single module needs to be constructed at a time. It is further noted that after construction that the modules are easily transported to the final processing area where they will be quickly assembled and put into use.

EXAMPLE 5

Each of the above apparatus assemblies is used to carry out an identical set of four wet processing steps in solutions that are initially made up in large batches, filtered to remove particulate contaminants, and then split into four equal parts and placed in identical sets of tanks within each of the four apparatuses. The four sequential processing steps are carried out on an identical number of integrated circuit chips, Each chip containing a multitude of individual circuits. All other processing steps, before and after these wet processing steps, are carried out in an identical manner, so that the only significant variable is the difference in the processing apparatus. The performance of the resulting integrated circuits is measured:

The integrated circuit chips from the apparatus of example 1 are found to have no flaw-free integrated circuits and to have most of the integrated circuits so flawed as to be unusable.

The chips from the apparatus of example 2 are found to have some flaw-free integrated circuits and to have a large percentage of the integrated circuits so flawed as to be unusable.

The chips from the apparatus of example 3 are found to have slightly more flaw-free integrated circuits and to have fewer of the integrated circuits so flawed as to be unusable.

The chips from the apparatus of example 4 are found to surprisingly have almost all flaw-free integrated circuits and to even more surprisingly have a neglectable number of the integrated circuits so flawed as to be unusable.

Various modifications may be made in the present invention without departing from the spirit or scope thereof as will be apparent to those skilled in the art.

What is claimed is:

1. In a device for wet-processing of integrated circuits and delicate electronic components and devices, said device comprising a robotic arm having a driving mechanism having moving surfaces in contact with each other and having means to grip or otherwise hold individual and groups of integrated circuits and delicate electronic devices while being processed, means for filtering air and means for the addition and removal of said integrated circuits and delicate electronic devices into and out of processing stations, the improvement comprising a generally circular multi-modular device containing substantially identical wet-processing baths located around said robotic arm and the driving mechanism for said robotic arm is enclosed in a cover whereby the moving surfaces of said arm that are in contact with each other are isolated from the atmosphere surrounding the wet-processing baths.

2. A device constructed as in claim 1 which includes 6 modules.

3. A device constructed as in claim 1 which includes 8 modules.

4. A device constructed as in claim 1 wherein said modules do not form a complete circle.

5. A series of two or more of the devices of Claim 1 connected so that items may be passed from the robot arm of one multi-modular device to the robot arm of another multi-modular device.

6. Device of claim 1 including means to exhaust air from within said cover.

* * * * *